United States Patent [19]
Heiberger et al.

[11] Patent Number: 6,002,315
[45] Date of Patent: Dec. 14, 1999

[54] INNER COLD-WARM SUPPORT STRUCTURE FOR SUPERCONDUCTING MAGNETS

[75] Inventors: Michael Heiberger, Del Mar; William Patrick Creedon, San Diego, both of Calif.

[73] Assignee: General Atomics, San Diego, Calif.

[21] Appl. No.: 08/819,378

[22] Filed: Mar. 17, 1997

[51] Int. Cl.$^6$ ....................................................... H01F 1/00
[52] U.S. Cl. ............................ 335/216; 335/300; 324/318
[58] Field of Search ................................. 335/216, 297, 335/299, 300; 174/15.5; 324/318–20

[56] References Cited

U.S. PATENT DOCUMENTS

| | | |
|---|---|---|
| 2,777,099 | 1/1957 | Foss . |
| 4,498,048 | 2/1985 | Lee et al. . |
| 4,538,130 | 8/1985 | Gluckstern et al. . |
| 4,646,044 | 2/1987 | Kuno et al. .............................. 335/299 |
| 4,672,346 | 6/1987 | Miyamoto et al. . |
| 4,723,873 | 2/1988 | Masznyik . |
| 4,724,677 | 2/1988 | Foster . |
| 4,818,966 | 4/1989 | Miyamoto et al. . |
| 4,853,661 | 8/1989 | Palkovich . |
| 4,896,128 | 1/1990 | Wollan et al. . |
| 4,943,774 | 7/1990 | Breneman et al. . |
| 5,025,632 | 6/1991 | Spritzer . |
| 5,093,645 | 3/1992 | Dorri et al. .............................. 335/216 |
| 5,117,188 | 5/1992 | Ohkawa . |
| 5,530,413 | 6/1996 | Minas et al. .............................. 335/216 |
| 5,691,678 | 11/1997 | Gore et al. ................................ 335/216 |

*Primary Examiner*—Lincoln Donovan
*Attorney, Agent, or Firm*—Nydegger & Associates

[57] ABSTRACT

A superconductor device which including a magnet coil assembly and support structures. The magnet coil assembly consists of superconducting wire which is encased in a composite structure along with an integral thermal interface. This combination forms the magnet coil assembly. The magnet coil assembly is cooled to an operating temperature of about 5K with a conductive cooling device that physically connects with the thermal interface integral to the magnet coil assembly. A cold-to-warm support structure supports the magnet coil assembly within a vacuum vessel while thermally isolating it from the external environment Structurally, the magnet coil assembly is cylindrically shaped and positioned within a toriodal shaped thermal shield which is positioned within a toroidal shaped vacuum vessel. The cold-to-warm support structure supports the magnet coil assembly spaced apart from the thermal shield. The cold-to-warm support structure includes a tapered section and an annular section. The tapered section is shaped as a truncated cone and is attached to a proximal end of the vacuum vessel. The tapered cone extends distally and projects radially into the vacuum chamber. The tapered cone passes through an interface in the thermal shield and is connected to a second end of the annular section. The annular section extends proximally from the tapered section and includes a first end that is connected to the magnet coil assembly.

22 Claims, 1 Drawing Sheet

INNER COLD-WARM SUPPORT STRUCTURE FOR SUPERCONDUCTING MAGNETS

FIELD OF THE INVENTION

The present invention relates generally to a superconducting magnet ("SM"). More specifically, the present invention relates to a lightweight superconducting magnet coil ("SMC") and a support structure for supporting the SMC. The present invention is particularly, but not exclusively useful as a lightweight, conduction-cooled, SMC and support structure having enhanced stability and thermal isolation.

BACKGROUND OF THE INVENTION

In recent years, the use of SMs have become increasingly commonplace. For example, SMs are routinely utilized by magnet resonance imaging ("MRI") systems for imaging structures internal to the human body. Typically, an SM includes a magnet coil composed of superconducting wire that is immersed in a cryogenic fluid which maintains the coil at its superconducting temperature. The widespread use of SMCs in MRI systems is due to the ability to offer a combination of high field strength, low power consumption and relatively low mass.

Outside the field of medical MRI systems, the use of SMCs can be more problematic. For example, for some applications, the size and weight of typical SMC and the use of cryogenic fluids may be unacceptable. Applications of this type include mobile applications, such as shipboard and airborne applications.

A number of designs have attempted to overcome the difficulty associated with the use of SMCs in demanding environments. For example, refrigeration devices such as cryocoolers have been used to conduction cool SMCs to the required operating temperature, i.e., typically less than 10 degrees Kelvin.

However, conduction cooled SMCs have proven to be problematic. In order to operate satisfactorily and achieve the required low operating temperatures, the cooling requirements of the cryocoolers must be minimized. Existing designs have not been able to minimize all sources of heat in and around the SMC and thermally isolate the SMC to minimize the cooling requirements of the cryocooler. Thus, the cryocooler is often unable to cool or maintain the SMC at the required operational temperature and the SMC ceases to superconduct and becomes electronically resistive.

Sources of heat in existing designs include: (i) heat caused by eddy currents in the superconducting wire; (ii) heat caused by eddy currents in the support structure(s) which support the superconducting wire and suspend the SMC from a vacuum vessel and from eddy currents generated in thermal buswork; (iii) heat transferred from the vacuum vessel which is at ambient temperature through the cold-to-warm support structure; and (iv) heat created around the superconducting wire and the support structure(s) caused by stress.

It is well known, that by reducing the mass of the SMC, the mass of the support structure(s) can also be reduced and the heat generated by eddy currents and heat transferred through the support structure(s) are also reduced. However, the design of a lightweight SMC has proven to be problematic. Since the mass of the SMC is reduced, the current density of the SMC must increase. Therefore, the internal stresses generated by the magnet field will also increase. This creates a structural integrity problem for the SMC and the associated support structure(s) which must resist the magnetic forces generated by the SMC. It has proven difficult to design a lightweight SMC and associated support structure(s) with adequate strength to withstand these increased magnetic forces and the shock and vibration caused by motion in the case of a mobile system.

Further, the change in temperature causes dimensional changes in the SMC and the support structure(s) which, in turn, may increase internal stress or result in physical repositioning of the SMC itself relative to the surrounding structures. These stresses caused by temperature changes can physically damage the structure of the SMC and the support structure(s) and de-stablize the SMC.

In light of the above, it is an object of the present invention to provide a SMC and support structure(s) which are lightweight, while retaining sufficient strength in the presence of internally produced high magnetic fields and externally induced forces from shock and vibration. It is an also object of the present invention to provide an SMC which is lightweight while retaining sufficient strength for deployment in a variety of environments. It is another object of the present invention to provide a SMC and support structure which reduces internal stress within the SMC and support structure during cooling of the SMC. Yet another object of the present invention is to provide an SMC and cold-to-warm support structure which provides a high degree of thermal isolation for the SMC and enhanced stability. Another object of the present invention is to provide structural and thermal interfaces to the SMC that do not conduct eddy currents and do not result in undesirable heating.

SUMMARY

The present invention is directed to a superconducting magnet coil assembly and a cold-to-warm support structure which are components of a superconductor device. The magnet coil assembly includes a tubular inner structure, a superconductive wire wrapped around and contacting at least a portion of an outer surface of the inner structure, and a tubular outer structure which contacts the wire and is substantially concentric with the inner structure. As provided in detail below, the inner structure and the outer structure cooperate to relieve stress created in the superconducting wire, thereby allowing for higher magnetic fields, a lighter weight magnet coil assembly and a lighter weight cold-to-warm support structure.

The inner structure and the outer structure of the magnet coil assembly are made of a composite material. Preferably, the composite material includes fibers retained together with epoxy and the fibers are oriented so that the inner structure and the outer structure have a coefficient of thermal expansion which substantially corresponds to that of the wrapped superconducting wire. This allows the inner structure and outer structure to expand or contract at substantially the same rate as the superconducting wire to minimize internal stress generated during expansion or contraction.

Additionally, the magnet coil assembly includes a thermal interface interwoven with at least a portion of the superconducting wire to increase the thermal conductivity of the magnet coil. For example, the thermal interface can be a copper wire having a pair of unconnected ends to eliminate eddy currents in the thermal interface. The thermal interface can be physically connected to a refrigeration device such as a cryocooler to cool the magnet coil assembly.

The superconductor device also includes a toroidal shaped thermal shield having an internal, toroidal shaped, shield cavity which substantially encircles the magnet coil to substantially thermally isolate the magnet coil. Further, the superconductor device can include a toroidal shaped vacuum vessel having an internal, toroidal shaped, vessel chamber that substantially encircles the thermal shield to further isolate the magnet coil.

The cold-to-warm support structure supports the magnet coil assembly by its inner structure. Further, the cold-to-warm support structure supports the thermal shield spaced apart from the vessel chamber and the magnetic coil spaced apart from the shield cavity. As provided herein, since the inner structure and outer structure, which are part of the magnet coil assembly, are used to relieve the stress in the superconducting wire, the weight of the cold-to-warm support structure can be minimized, since its primary role is to support the magnet coil assembly and not to contribute to significant magnetically induced load sharing.

The cold-to-warm support structure provided herein includes a tubular, tapered section and a tubular annular section. The tapered section has an inner diameter which increases from a proximal end that is secured to the vacuum vessel to a distal end that is disposed within the thermal shield proximate the inner structure. The annular section is disposed within the thermal shield. The annular section has a first end which is secured to the inner structure of the magnet coil assembly and a second end which is secured to the distal end of the tapered section. This unique design minimizes the heat loss through the support structure by increasing the length that the heat must travel.

Preferably, for ease of manufacturing and structural integrity, the cold-to-warm support structure includes a scarf type, first joint and a scarf type, second joint. The first joint secures the proximal end of the tapered section to the vacuum vessel while the second joint secures the second end of the annular section to the distal end to the tapered section.

The term "scarf type joint" as used herein shall mean a joint made by beveling two pieces and fastening them together so that they lap over and join firmly into one continuous piece. Optimally, the scarf type joint includes fasteners and an adhesive to hold the two pieces together.

Also, at least one and more preferably both of the joints are made of a composite material having of coefficient of thermal expansion which corresponds to that of the support structure proximate the respective joint to minimize any stress caused by thermal expansion.

It is important to recognize that the magnet coil assembly and cold-to-warm support structure of the present invention are lightweight compared to previous designs and sufficiently strong to withstand internally produced high magnetic fields and externally induced forces from shock and vibration. Further, the magnet coil assembly is lightweight and retains sufficient strength for deployment in a variety of environments. Also, the cold-to-warm support structure of the present invention provides a high degree of thermal isolation for the magnet coil. Additionally, the cold-to-warm support structure, the inner structure and the outer structure of the magnet coil assembly expand and contract at substantially the same rate as the superconducting wire to reduce stress in the system and minimize heat created by friction due to differential motions under stress.

It should be noted that eddy currents can be generated in surrounding components during magnet coil charging and discharging that represent unwanted sources of heat. This is eliminated through the use of non-electrically conductive composite material structures surrounding the superconducting magnet coil. In addition, the main thermal interface of the superconducting magnet coil, consists of a copper wire coil covered with a thin layer of electrical insulation such as varnish, with unconnected ends, so electric eddy currents can not flow through it and generate heat.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
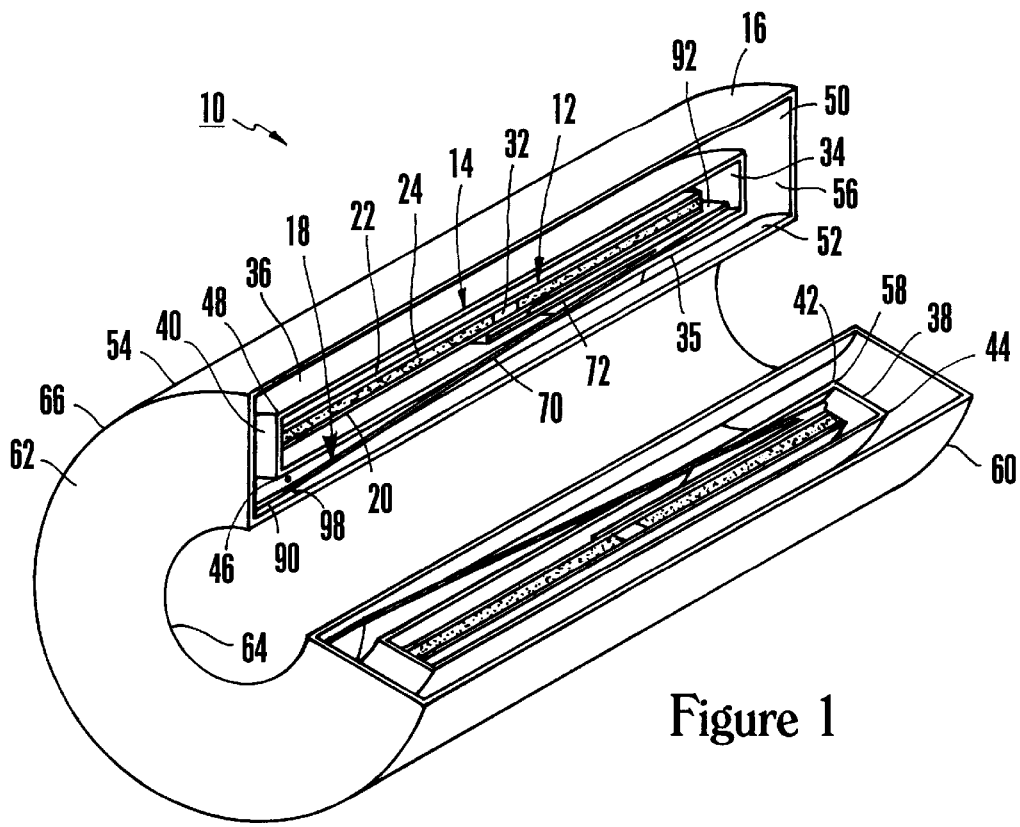
FIG. 1 is an isometric view of a superconductor having features of the present invention, shown with a portion removed for clarity.

Referring initially to FIG. 1, the present invention is a superconductor device 10 which includes a magnet coil assembly 12, a thermal shield 14, a vacuum vessel 16 and a cold-to-warm support structure 18 for supporting the magnet coil assembly 12 away from the thermal shield 14 and the vacuum vessel 16. The size and shape of the components of the superconductor device 10 vary according to requirements of the superconductor device 10. Accordingly, the invention is not limited to the embodiments described below and shown in the Figures.

The magnet coil assembly 12 is generally tubular shaped and includes: (i) a tubular inner structure 20; (ii) a superconducting wire 22 wrapped around the inner structure 20; and (iii) a tubular outer structure 24. The inner structure 20 and outer structure 24 are substantially coaxial and substantially concentric. As provided below, the unique design of the inner structure 20 and the outer structure 24 allows these structures to support the superconducting wire 22 and relieve stress in the superconducting wire 22 caused by high magnetic fields. This allows for higher current densities in the superconducting wire 22 and a lighter weight magnet coil assembly 12.

The inner structure 20 and outer structure 24 are preferably made of a composite material having relatively low weight to minimize the weight of the magnet coil assembly 12 and relatively low electrical conductivity to minimize heat created by eddy currents. Optimally, the inner structure 20 and outer structure 24 are made of a fiber-epoxy composite material and the fibers are oriented so that the inner structure 20 and the outer structure 24 have: (i) a relatively high strength and stiffness to relieve stress generated in the superconducting wire 22; and (ii) a directionally dependent coefficient or rate of thermal expansion which substantially corresponds or is similar to that of the wrapped superconducting wire 22 to minimize stress caused by thermal expansion between the superconducting wire 22 the inner and outer structures 20, 24.

Materials such as oriented S-glass, E-glass, boron or carbon fibers in an epoxy matrix, or materials with similar structural and thermal properties can be utilized for the inner structure 20 and the outer structure 24. The required orientation of the fibers depends upon the coefficient of thermal expansion of the superconducting wire 22 utilized. For example, if the axial change in length of the superconducting wire 22 is between room temperature and operating temperature (about 5 degrees Kelvin) is 0.3%, then the fibers within the inner and outer structure are wound at angles that result in substantially the same axial length change. This is possible, since the thermal expansion coefficients of the inner and outer structures depend on the fiber angle.

Figure 2:
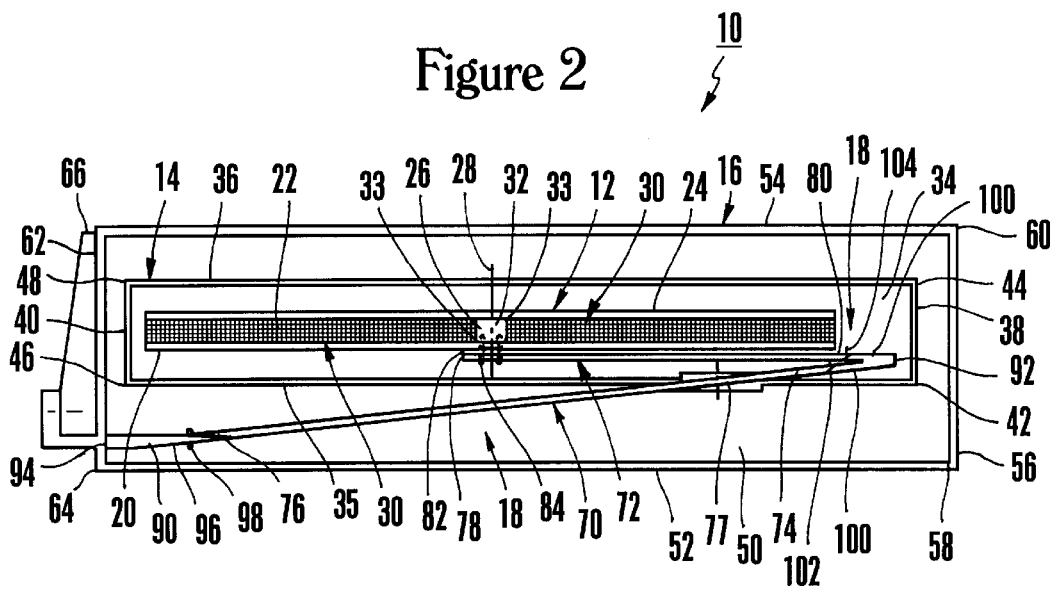
FIG. 2 is cross-sectional view of the superconductor of FIG. 1.

Referring to FIG. 2, the inner structure 20 also includes a plurality of spaced apart inner fastener receivers 26, e.g., blind rivets, for securing the magnet coil assembly 12 to the cold-to-warm support structure 18 as provided below. The inner fastener receivers 26 are preferably positioned proximate a centerline 28 of the magnet coil assembly 12 to minimize any rotational moments when the cold-to-warm support structure 18 supports the magnet coil assembly 12.

The superconducting wire 22 is repeatedly wrapped around an outer surface 30 of the inner structure 20 and is positioned between the inner structure 20 and the outer structure 24. As is well known, superconducting wire 22 conducts electrical current without substantial resistance when cooled to cryogenic temperatures. A number of compounds and alloys exhibit superconductivity and can be used in the present invention. For example, superconducting wire 22 made from copper and niobium-titanium and sold by IGC Advanced Superconductors can be utilized in the present invention.

Preferably, the magnet coil assembly 12 includes a thermal interface 32 which increases the thermal conductivity of the magnet coil assembly 12 to facilitate cooling of the superconducting wire 22. In the embodiment shown in the Figures, the thermal interface 32 is a flexible wire or coil which is interwoven with the superconducting wire 22 proximate the center line 28 of the magnet coil assembly 12. The thermal interface 32 can be made from a varnish-insulated copper wire or some other material exhibiting similar thermal transfer properties as the copper wire and thermal expansion characteristics similar to the superconducting wire 22. Preferably, ends 33 of the thermal interface 32 are spaced apart or unconnected to prevent a continuous loop which would develop eddy currents. Additionally, the thermal interface 32 can include flexible thermally conductive strips (not shown), interwoven with the thermal interface 32 to enhance thermal transfer between superconducting wire 22 and an external refrigeration device (not shown).

The thermal shield 14 surrounds and encircles the magnet coil assembly 12 and provides a thermal barrier between the cold gas which surrounds the magnet coil assembly 12 and the ambient temperature of the vacuum vessel 16. Referring to FIGS. 1 and 2, the thermal shield 14 is generally toroidal shaped and includes an internal, generally toroidal shaped, shield cavity 34 which encircles the magnet coil assembly 12. The thermal shield 14 shown in the Figures is substantially coaxial and concentric with the magnet coil assembly 12.

Structurally, the thermal shield 14 includes a cylindrical inner member 35, a cylindrical outer member 36, a distal end plate 38 having an annular shape, and a proximal end plate 40 also having an annular shape. The inner member 35 is concentric within the outer member 36. A distal end of the inner member 35 connects to an inner circumference 42 of the distal end plate 38 and a distal end of the outer member 36 connects to an outer circumference 44 of the distal end plate 38. Similarly, a proximal end of the inner surface 35 connects to the inner circumference 46 of the proximal end plate 40 and a proximal end of the outer surface 36 connects to the outer circumference 48 of the proximal end plate 40. The thermal shield 14 can be fabricated from aluminum or an alloy thereof or a material which exhibits similar thermal and structural characteristics.

The vacuum vessel 16 is generally toroidal shaped and includes an internal, generally toroidal shaped vessel chamber 50 that encircles the thermal shield 14. The vacuum vessel 16 provides a vacuum which isolates the magnet coil assembly 12. The vacuum vessel 16 shown in the Figures is substantially concentric and coaxial with the thermal shield 14 and the magnet coil assembly 12.

Structurally, the vacuum vessel 16 includes a tubular inner member 52, a tubular outer member 54, a distal end plate 56 and a proximal end plate 62. The distal end plate 56 is placed at distal ends of the inner member 52 and outer member 54. The distal end plate 58 has an annular shape with an inner circumference 56 and an outer circumference 60. The inner circumference 58 is attached to inner member and the outer circumference 60 is attached to the outer member 54. In a similar fashion, the proximal end plate 62, formed with an annular shape, is positioned at proximal ends of the inner member 52 and outer member 54. The proximal end plate 62 has an inner circumference 64 attached to the inner member 52 and an outer circumference 66 attached to the outer member 54. The combination of the inner member 52, outer member 54, distal end plate 56 and proximal end plate 62 results in the substantially sealed vacuum vessel 16 which defines the vacuum chamber 50. The vacuum vessel 16 can be fabricated from aluminum, titanium, an alloy thereof, or a material which exhibits similar structural and thermal characteristics.

Importantly, the vacuum vessel 16, the thermal shield 14, and the magnet coil assembly 12 are spaced apart. Referring to FIG. 2, the magnet coil assembly 12 is separated from the thermal shield 14 and the thermal shield 14, in turn, is separated from the vacuum vessel 16 by the cold-to-warm support structure 18. Thus, the cold-to-warm support structure 18 suspends the magnet coil assembly 12 within the thermal shield 14 and the vacuum vessel 10.

The cold-to-warm support structure 18 extends between the vacuum vessel 16 which is at ambient temperature and the magnet coil assembly 12 which operates at a cryogenic temperature. In the embodiment shown in the Figures, the cold-to-warm support structure 18 includes a tubular, tapered section 70 and a tubular, annular section 72. This unique shape minimizes heat loss through the cold-to-warm support structure 18 since heat must travel a long distance. Further, this unique shape allows the cold-to-warm support structure 18 to be relatively compact.

The tapered section 70 is formed as a hollow truncated cone having a distal end 74 and a proximal end 76. The tapered section 70 is disposed in a mutually coaxial relationship with the vacuum vessel 16, the thermal shield 14 and the magnet coil assembly 12. Within the vessel chamber 50, the proximal end 76 of the tapered section connects to the vacuum vessel 16 at a location which is adjacent to the proximal end plate 62 and the inner member 52. The distal end 74 of the tapered section projects inward from the proximal end plate 62 and upward from the inner member 52 into the vacuum chamber 50. The distal end 74 terminates at a location within the shield cavity 34, proximate to the distal end plate 38 of the thermal shield and proximate to the magnet coil assembly 12.

An intermediate portion 77 of the tapered section 70 between the distal end 74 and the proximal end 76, extends through the thermal shield 14 and secures the thermal shield 14 spaced apart from the magnet coil assembly 12 and the vacuum vessel 16. The thermal shield 14 can be attached to the intermediate portion 77 in a number of alternate ways. For the embodiment shown in the Figures, the intermediate portion 77 is attached by a scarf joint, with a combination adhesive bond and fastener.

The annular section 72 is formed as a hollow cylinder having a first end 78 for attachment to the magnet coil assembly 12 and a second end 80 which attaches to the distal end 74 of the tapered section. Spatially, the annular section 72 is coaxial with and positioned substantially over the tapered section 70.

The location where the first end 78 of the annular section 72 attaches to the magnet coil assembly 12 is designed primarily to react gravity loads since the cold-to-warm support structure 18 does not have a significant role in reducing the magnetic forces created by the magnet coil assembly 12. The inner structure 20 and outer structure 24 of the magnet coil assembly 12 mainly reduce the magnetic forces. Preferably, however, the first end 78 is attached proximate the center line 28 of the magnet coil assembly 12 to minimize any rotational moments when the cold-to-warm support structure 18 supports the magnet coil assembly 12. Accordingly, the first end 78 of the annular section 72 projects towards the proximal end plate 40 of the thermal shield and terminates at a location substantially midway between the proximal end plate 40 and the distal end plate 38 of the thermal shield.

Referring to FIG. 2, the cold-to-warm support structure 18 includes an annular ring 82 formed on an outer surface of the annular section 72 proximate the first end 78. The annular ring 82 serves as a mounting point or interface between the magnet coil assembly 12 and the annular section 72. Further, the annular ring 82 provides a gap between the magnet coil assembly 12 and the annular section 72 to better thermally isolate the magnetic coil assembly 12. In the embodiment shown in the Figures, the annular ring 82 is attached to the inner structure 20 of the magnet coil assembly 12 proximate the center line 28.

Referring to FIG. 2, a plurality of coil fasteners 84 engage the fastener receivers 26 in the inner structure 20 to attach the magnet coil assembly 12 to the annular section 72. As shown in the Figures, the coil fasteners 84 can each be a blind rivet or a lock bolt which extends through an aperture in the annular ring 82 to allow the annular section 72, the annular ring 82 and the magnetic coil assembly 12 to be securely fastened together. Further, an adhesive, such as an epoxy, can be disposed between the annular ring 82 and the magnet coil assembly 12 to strengthen the connection.

Preferably, the cold-to-warm support structure 18 is made of a composite material having relatively low weight, relatively low electrical conductivity, relatively poor thermal conductivity, relatively high strength and relatively high stiffness. Optimally, the cold-to-warm support structure 18 is made of a fiber epoxy composite material with the fibers oriented so that the cold-to-warm support structure 18 has a coefficient or rate of thermal expansion which is substantially similar or corresponds to that of the magnetic coil assembly 12. This will minimize stress caused by thermal expansion and will maintain the proper orientation of the magnet coil assembly 12 in the shield cavity 34 and the thermal shield 14 within the vessel chamber 50.

The tapered section 70 and the annular section 72 can be formed from composite materials, such as, oriented E-glass or S-glass fibers in an epoxy matrix, or other fibers with similar structural or thermal properties, since these composites are strong, and are relatively non-conductive to heat and electricity.

It may be appreciated that the use of high-strength materials allows the tapered section 70 and the annular section 72 to be fabricated relatively thin, further decreasing the ability of these structures to conduct heat. At the same time, the use of epoxy-fiber materials allows the fibers included in the tapered section 70 and the annular section 72 to be selectively oriented to reduce internal stresses associated with the cooling of the superconductor wire 22 to cryogenic temperatures.

Also referring to FIG. 2, the cold-to-warm support structure 18 includes a first joint 90 which facilitates attachment of the cold-to-warm support structure 18 to the vacuum vessel 16 and a second joint 92 which facilitates manufacturing of the cold-to-warm support structure 18. Preferably, as provided below, the first joint 90 and the second joint 92 are scarf type joints as defined previously herein.

The first joint 90 is tubular and attaches the proximal end 76 of the tapered section 70 to the vacuum vessel 16. The first joint 90 is typically made from a material which is easily secured to the vacuum vessel 16 and includes a vessel end 94 that is secured to the proximal end plate 62 proximate the inner member 52. In the embodiment shown in the Figures, the first joint 90 is manufactured as an integral part of the proximal end plate 62 of the vacuum vessel 16. The first joint 90 also includes the beveled edge 96 which extends outwardly from the proximal end plate 62. The beveled edge 96 is secured to the proximal end 76 of the tapered section 70 which is also beveled to form the scarf type joint.

Vessel fasteners 98 are used in the first joint 90 and the proximal end 76 of the tapered section to secure the beveled edge 96 to the proximal end 76 of the tapered section. Additionally, an adhesive, such as epoxy, can be disposed therebetween to further secure the first joint 90.

Referring to FIG. 2, the second joint 92 attaches the tapered section 70 to the annular section 72. The second joint 92 is tubular and has a "V" shaped cross-section. The second joint 92 includes a beveled surface 100 at each end of the "V" to form a scarf type joint. One of the beveled surface 100 is for attachment to the distal end 74 of the tapered section which is also beveled and the other beveled surface 100 is for attachment to the second end 80 of the annular section which is also beveled.

First support fasteners 102 extend through the beveled surfaces 100 of the second joint 92 and the distal end 74 of the tapered section to secure one of the beveled surfaces 100 of the second joint 92 to the distal end 74 of the tapered section. Additionally, an adhesive, such as epoxy, can be disposed therebetween to further secure the second joint 92.

Similarly, a plurality of second support fasteners 104 extend through the other beveled surfaces 100 of the second joint 92 and the second end 82 of the annular section to secure that beveled surfaces 100 to the second end 82 of the annular section. Additionally, an adhesive, such as epoxy, can be disposed therebetween to further secure the second joint 92.

Preferably, the first joint 90 and the second joint 92 are made of a low electrically conductive material, such as titanium to minimize the effects of eddy currents. Further, the first and second joints 90, 92 have a rate or coefficient of thermal expansion which is similar to the other components of the cold-to-warm support structure 18 to reduce stresses caused by thermal expansion between the joints 90, 92 and the support structure 18.

OPERATION

An example of the operation of a superconductor device 10 having features of the present invention can best be visualized with reference to FIG. 1. The operation begins with cooling the magnet coil assembly 12 to cryogenic temperature. This can be accomplished by providing cold from a cooling device, such as a cryocooler into the shield cavity 34 proximate the magnet coil assembly 12. A flexible conductive interface (not shown) can be used to thermally connect the cooling device (not shown) to the thermal interface 32. The thermal interface 32 embedded in the superconducting wire 22 enhances the thermal transfer to the superconducting wire 22. The components in and around the magnet coil assembly 12, are designed to thermally expand at substantially the same rate so that stress in these structures are minimized. The cold-to-warm support structure 18 is designed to minimize the heat transferred from the vacuum vessel 16.

Once the magnet coil assembly 12 is at the required temperature, electric current is supplied from an electrical power supply (not shown) to the superconducting wire 22. The inner structure 20 and the outer structure 24 support the superconducting wire 22 and relieve stress in the superconducting wire 22 caused by high magnetic fields. The cold-to-warm support structure 18 is therefore designed mainly to support the weight of the magnet coil assembly 12 and not serve to react magnetic forces. Therefore, the magnet coil assembly 12 and the cold-to-warm support structure 18 can be made lighter, since all the structural elements can be fabricated from relatively lightweight high strength composite materials using fibers such as E-glass and S-glass, carbon, or boron.

During startup and operation, the cooling requirements of the cooling device are reduced since the required mass of the magnet coil assembly 12 assembly is reduced, the thermal interface 32 enhances thermal transfer to the magnet coil assembly 12, the heat from eddy currents is greatly reduced, and the heat transfer through the long cold-to-warm support structure 18 is reduced.

While the particular superconductor device 10 including the magnet coil assembly 12 and cold-to-warm support structure 18, as herein shown and disclosed in detail, is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A superconductor device comprising
   a vacuum vessel;
   a tubular magnet coil assembly; and
   a cold-to-warm support structure which supports the magnetic coil assembly, the cold-to warm support structure including (i) a tubular, tapered first section having an inner diameter which increases from a proximal end that is secured to the vacuum vessel to a distal end, the first section being substantially coaxial with the magnet coil assembly and (ii) an annular second section positioned near the magnet coil assembly, the annular second section having a first end which is secured to the magnet coil assembly and a second end which is secured proximate to the distal end of the tapered first section.

2. The magnet coil assembly of claim 1 wherein the inner support structure and the outer support structure are made of a composite material which includes fibers retained together with epoxy and the fibers are oriented so that the inner support structure and the outer support structure have a coefficient of thermal expansion which substantially corresponds to that of the wrapped wire.

3. The superconductor device of claim 1 wherein the cold-to-warm structure is made of a non-electrically conductive composite material.

4. The superconductor device of claim 3 wherein the composite material includes fibers retained together with epoxy and the fibers are oriented so that the cold-to-warm support structure has a coefficient of thermal expansion which substantially corresponds to that of the magnetic coil assembly.

5. The superconductor device of claim 4 comprising:
   a thermal shield positioned within the vacuum vessel, the thermal shield having an internal shield cavity which substantially encircles the magnet coil assembly; wherein, the cold-to-warm support structure supports the thermal shield spaced apart from the vessel chamber and the magnet coil assembly spaced apart from the shield cavity.

6. The superconductor device of claim 1 wherein the cold-to-warm support structure includes:
   a scarf type, first joint which secures the proximal end of the tapered first section to the vacuum vessel; and
   a scarf type, second joint securing the second end of the annular second section to the distal end to the tapered first section.

7. The superconductor device of claim 6 wherein at least one of the joints is made of a composite material including fibers retained together with epoxy, wherein the fibers are oriented so the composite material has a coefficient of thermal expansion which corresponds to that of the cold-to-warm support structure proximate that respective joint.

8. The magnetic coil assembly of claim 1 wherein the inner support structure and the outer support structure are made of a composite material which includes fibers retained together with epoxy and the fibers are oriented to diminish stress caused by the thermal expansion, thermal contraction and magnetic loads of the wrapped superconducting wire; wherein the inner support structure encircles at least a portion of the cold-to-warm support structure.

9. The magnetic coil assembly of claim 8 wherein the composite material is substantially non-electrically conductive.

10. A cold-to-warm support structure for supporting a tubular magnet coil assembly to a vacuum vessel, the cold-to-warm support structure comprising:
    a tubular, tapered first section having an inner diameter which increases from a proximal end to a distal end, the proximal end being adapted to be secured to the vacuum vessel, the tapered section being substantially coaxial with the magnet coil assembly; and
    a second section having a first end which is suitable for attachment to the magnet coil assembly and a second end which is secured to the distal end of the tapered first section.

11. The cold-to-warm support structure of claim 10 wherein the second section is substantially annular, substantially coaxial with the first section and encircles a portion of the first section; wherein the first and second sections are made of a composite material which includes fibers retained together with epoxy; and the fibers are oriented so that the cold-to-warm support structure has a coefficient of thermal expansion which substantially corresponds to that of the magnet coil assembly.

12. The support structure of claim 11 comprising:
    a scarf type, first joint which is adapted to secure the proximal end of the tapered first section to the vacuum vessel; and a scarf type, second joint securing the second end of the second section to the distal end to the tapered first section.

13. The cold-to-warm support structure of claim 12 wherein at least one of the joints is made of a non-conductive composite material including fibers retained by epoxy, oriented so the composite material having of coefficient of thermal expansion which corresponds to that of the cold-to-warm support structure proximate that respective joint.

14. A superconductor device comprising the cold-to-warm support structure of claim 12 supporting a magnet coil assembly, the magnet coil assembly comprising:
   a tubular inner support structure that is made of a substantially non-electrically conductive composite material;
   a superconductive wire wrapped around at least a portion of the inner support structure; and
   a tubular outer support structure which substantially surrounds and supports the wire, the outer support structure being substantially concentric with the inner support structure and being made of a substantially non-conductive composite material.

15. The superconductor device of claim 14 wherein the composite material of the inner support structure and the outer support structure include fibers retained together with epoxy and the fibers are oriented so that the inner support structure and the outer support structure have a coefficient of thermal expansion which substantially corresponds to that of the wrapped superconducting wire.

16. The superconductor device claim 15 wherein the magnet coil assembly includes a thermal interface interwoven with at least a portion of the superconducting wire.

17. The cold-to-warm support structure of claim 10 wherein the second section is substantially annular and the first end of the second section is adapted for attachment to an inner structure of the magnet coil assembly, proximate a center line of the magnet coil assembly.

18. The cold-to-warm support structure of claim 10 wherein the first and second sections are made of a non-electrically conducting composite material which includes fibers retained together with epoxy, and the fibers are oriented to provide adequate strength to support the magnet coil assembly; wherein the first and second sections are adapted to be encircled by the magnet coil assembly.

19. A superconductor device comprising:
   a magnet coil assembly comprising: (i) a tubular inner support structure that is made of a substantially non-electrically conductive composite material; (ii) a superconductive wire wrapped around the inner support structure and; (iii) a tubular outer support structure which supports the superconductive wire, the outer support structure being substantially concentric with the inner support structure and being made of a substantially non-electrically conductive composite material;
   a thermal shield having an internal shield cavity which substantially encircles the magnet coil assembly;
   a vacuum vessel having an internal vessel chamber that substantially encircles the thermal shield;
   a cold-to-warm support structure supporting the thermal shield spaced apart from the vessel chamber and the magnet coil assembly spaced apart from the shield cavity, the cold-to-warm support structure being at least partly encircled by the magnet coil assembly the cold-to-warm support structure including: (i) a tapered, tubular first section having an inner diameter which increases from a proximal end that is secured to the vacuum vessel to a distal end that is disposed within the thermal shield proximate the inner structure, the first section including an intermediate portion which extends through and attaches to the thermal shield, the first section being substantially coaxial with the magnet coil assembly; (ii) a second section disposed within the thermal shield, the second section having a first end which is secured to the inner support structure and a second end which is secured to the distal end of the tapered first section, the second section being substantially coaxial with the magnet coil assembly; (iii) a scarf type, first joint which secures the proximal end of the tapered section to the vacuum vessel; and (iv) a scarf type, second joint securing the second end of the second section to the distal end to the tapered first section.

20. The superconductor device of claim 19 wherein the cold-to-warm support structure is made of a composite material which includes fibers retained together with epoxy and the fibers are oriented so that the cold-to-warm support structure has a coefficient of thermal expansion which substantially corresponds to that of the magnet coil assembly.

21. The superconductor device of claim 19 wherein at least one of the joints is made of a composite material having a coefficient of thermal expansion which corresponds to that of the support structure proximate that respective joint.

22. The superconductor device of claim 19 wherein the composite material of the inner support structure and the outer support structure include fibers retained together with epoxy and the fibers are oriented so that the inner structure and the outer structure have a coefficient of thermal expansion which substantially corresponds to that of the wrapped superconducting wire.

\* \* \* \* \*